(12) United States Patent
Watanabe et al.

(10) Patent No.: US 6,453,001 B2
(45) Date of Patent: Sep. 17, 2002

(54) X-RAY EXPOSURE APPARATUS

(75) Inventors: Yutaka Watanabe, Tochigi; Mitsuaki Amemiya, Saitama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/853,712

(22) Filed: May 14, 2001

(30) Foreign Application Priority Data

May 19, 2000 (JP) ........................................ 2000-148832

(51) Int. Cl.[7] .............................................. H01L 21/30
(52) U.S. Cl. ........................................ 378/34; 378/146
(58) Field of Search .......................... 378/34, 84, 85, 378/119, 120, 147, 146

(56) References Cited

U.S. PATENT DOCUMENTS

| | | | |
|---|---|---|---|
| 4,896,341 A | 1/1990 | Forsyth et al. | 378/34 |
| 4,935,947 A | * 6/1990 | Amemiya | 378/119 |
| 5,177,774 A | * 1/1993 | Suckewer et al. | 378/43 |
| 5,825,844 A | 10/1998 | Miyake et al. | 378/34 |
| 5,835,560 A | 11/1998 | Amemiya et al. | 378/34 |
| 5,923,719 A | 7/1999 | Watanabe | 378/34 |
| 5,949,844 A | 9/1999 | Watanabe | 378/34 |

OTHER PUBLICATIONS

J.S. Pearlman and J.C. Riordan, X–Ray Lithography Using a Pulsed Plasma Source, Journal of Vacuum Science Technology, 19(4), Nov./Dec. 1981, pp. 1190–1193.

* cited by examiner

Primary Examiner—David P. Porta
(74) Attorney, Agent, or Firm—Fitzpatrick, Cella, Harper & Scinto

(57) ABSTRACT

An X-ray exposure apparatus has a plasma X-ray source for generating X-rays by producing a plasma, and a collimator for converging X-rays that diverge from the X-ray source and reducing a global divergence angle to irradiate a mask with the X-rays. A local convergence angle as seen from one point on the mask is changed by moving the position or angle of the collimator in a direction perpendicular or parallel to the axis of the collimator. The pattern on the mask is transferred to a wafer using X-rays having a convergence angle thus controlled. As a result, controllable parameters are increased and a more suitable resist pattern can be obtained. In addition, process tolerance in terms of exposing finer patterns is improved.

25 Claims, 21 Drawing Sheets

X (μm)

F I G. 13A
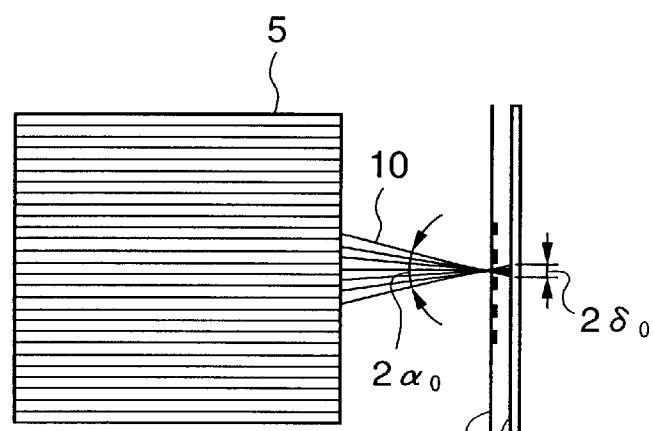
F I G. 13B
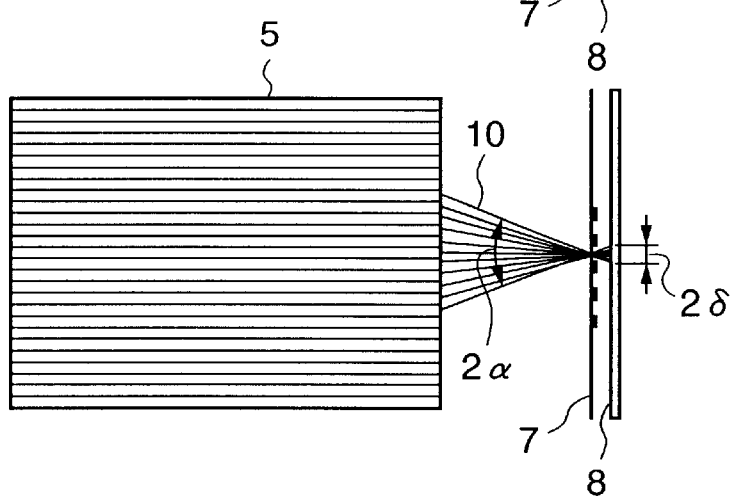

FIG. 16

| URL | http://www.maintain.co.jp/db/input.html |

MALFUNCTION DATABASE INPUT SCREEN

DATE OF OCCURRENCE [2000/3/15] ~404
MODEL [*********] ~401
SUBJECT MATTER [OPERATION ERROR (START-UP ERROR)] ~403
EQUIPMENT SERIAL NO. [465NS4580001] ~402
DEGREE OF URGENCY [D] ~405
CONDITION [LED CONTINUES FLASHING AFTER POWER IS TURNED ON] ~406
COUNTERMEASURE METHOD [POWER TURNED ON AGAIN (RED BUTTON PUSHED AT START UP)] ~407
PROGRESS REPORT [TEMPORARY MEASURES COMPLETED] ~408

[SEND] [RESET]      410                411                412
             LINK TO DATABASE OF RESULTS   SOFTWARE LIBRARY   OPERATION GUIDE

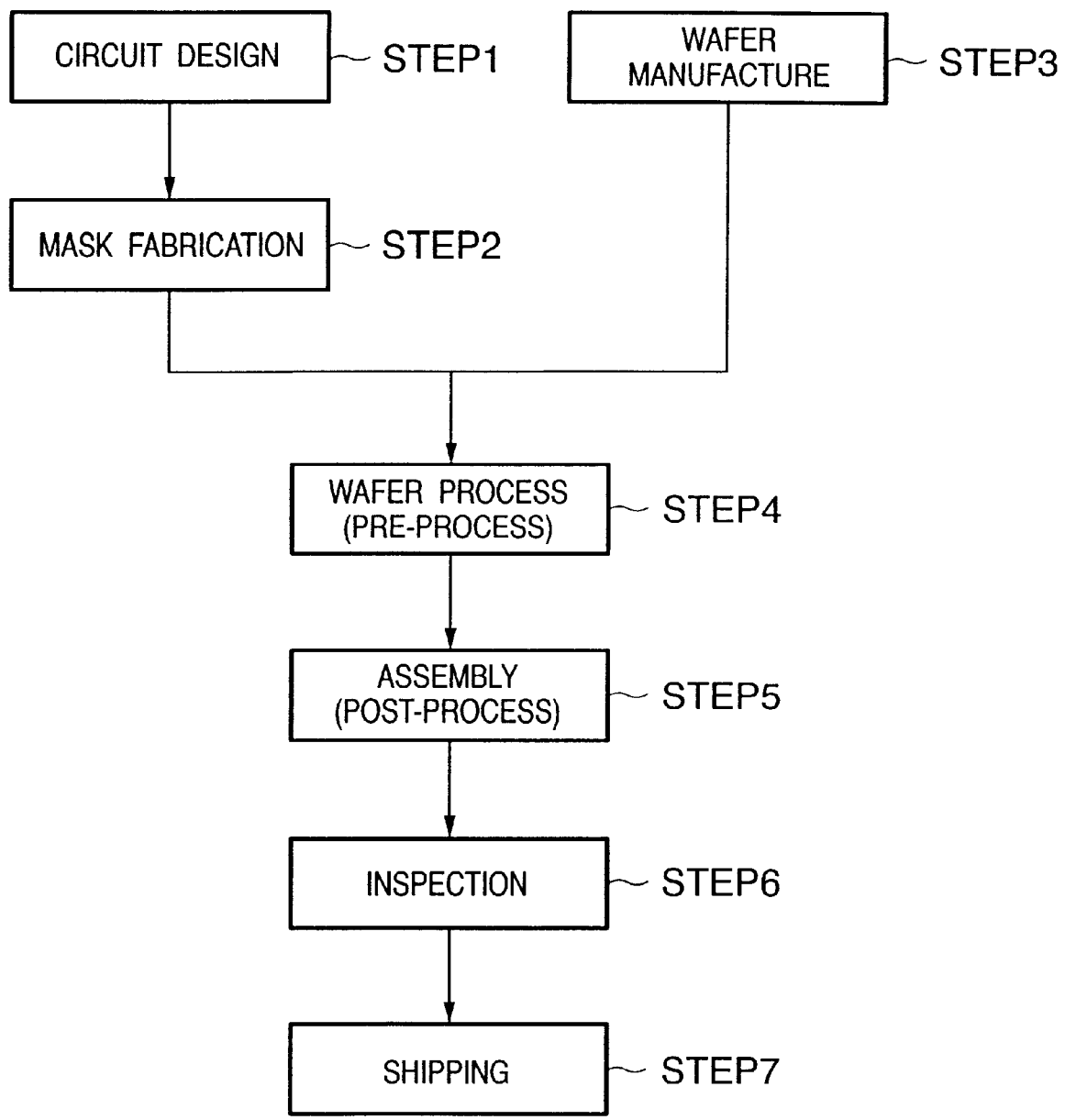
SEMICONDUCTOR DEVICE MANUFACTURING FLOW

X-RAY EXPOSURE APPARATUS

FIELD OF THE INVENTION

This invention relates to an X-ray exposure apparatus used in the manufacture of various devices, namely semiconductor chips such as IC and LSI chips, display devices such as liquid crystal panels, detector elements such as magnetic heads and image sensing devices such as CCDs, to a reticle such as a mask and to a device manufacturing method using the reticle.

BACKGROUND OF THE INVENTION

The recent increase in density and operating speed of semiconductor integrated circuits has been accompanied by a decrease in pattern line width of integrated circuits. Semiconductor manufacturing methods also demand much higher performance. For this reason, steppers utilizing shorter and shorter exposure wavelengths, e.g., extreme ultraviolet rays such as KrF lasers (having a wavelength of 248 nm), ArF lasers (having a wavelength of 193 nm) and $F_2$ lasers (having a wavelength of 157 nm) and X-rays (0.2~1.5 nm), have been developed for exposure apparatuses used in the formation of a resist pattern in the lithography part of the semiconductor manufacturing process.

With exposure using X-rays, an X-ray mask serving as a reticle on which a desired pattern has been formed is brought into close proximity with a wafer serving as a resist-coated substrate, and the X-ray mask is irradiated from above with X-rays to transfer the mask pattern to the wafer.

A method of exposure using a synchrotron light emission has been proposed for the purpose of obtaining high-intensity X-rays in such an X-ray exposure technique, and it has been shown that a pattern can be transferred with a wavelength of less than 100 nm. The synchrotron radiation light source, however, requires elaborate facilities. Though the source is effective in the production of semiconductor devices, it is not suitable for small devices used in prototypes, for example. Accordingly, there has also been proposed an exposure apparatus that employs an X-ray source which is small enough to be usable in prototypes and which generates X-rays of high intensity. One example is referred to as a "laser plasma ray source", as illustrated in the specification of U.S. Pat. No. 4,896,341. This apparatus irradiates a target with laser light from a laser to generate a plasma, and uses X-rays that are produced from the plasma. Another example generates a pinch plasma by electrical discharge in a gas, and produces X-rays from this plasma, as described in the Journal of Vacuum Science Technology 19(4), November/December 1981, p. 1190.

Regardless of which light source is used, the resolution of the transferred pattern declines because diffraction is utilized in X-ray exposure. The wavelength of X-rays is short and does not cause a decline in resolution. However, it has been found that the decline in resolution becomes a problem as the pattern to be transferred becomes extremely fine.

For example, X-ray intensity distribution on the surface of a wafer is as indicated by the solid line in FIG. 5. The curve is obtained as the result of calculation by Fresnel integration, in which the thickness of the absorbing body was 0.25 μm, the spacing between the X-ray mask and wafer was 10 μm and the mask was irradiated with perfectly collimated X-rays. The mask had a line-and-space pattern of transparent area 90 nm/absorbing area 90 nm. A peak in X-ray intensity appears below the transparent area and at other locations as well. When this pattern is transferred to a negative resist and then developed, the resist at locations where the X-ray intensity is greater than a fixed value remains after development and is resolved as a pattern. The fixed value is considered to be a slice level and is decided by the type of resist, development time, type of developing solution and temperature. In the case of a chemical amplification resist, the fixed value is decided also by the PEB (Post-Exposure Bake) conditions, namely temperature and time.

For example, FIG. 5 illustrates the result obtained by normalizing the X-ray intensity distribution on the wafer surface by the X-ray intensity below a sufficiently large transparent area. It is believed that if the slice level is 1.0, the resist between X1 and X2 will remain after development. Though the width of the resist pattern is, accurately speaking, different from the size L12 (=X2−X1) of the optical image, it will be understood that they approximately coincide, with the value being 66 nm.

Next, the size of the transparent area is gradually changed, the X-ray intensity distribution is calculated and the width of the resist pattern is found from the size of the optical image. This is indicated by the solid line in FIG. 7. Here the width of the transparent area is plotted along the horizontal axis and the size of the resist pattern along the vertical axis. The slice level is changed to 0.8, 0.6 and 0.4, as indicated by the dotted line, broken line and dot-and-dash line, respectively.

However, it will be understood from FIG. 7 that there is a region of transparent areas in which the width of the resist pattern does not necessarily increase but decreases instead and a region in which there is no change in the width of the resist pattern as the mask pattern size, i.e., the size of the transparent area, increases. This indicates that performing exposure using a mask consisting of a mixture of patterns having a plurality of sizes in these regions is difficult. The reason for this is as follows: In this region of mask pattern sizes, X-rays that have passed through the transparent area collect in the diffraction peak and act in a direction that raises X-ray intensity and not in a direction that broadens the width of the X-ray intensity pattern. For example, FIG. 6 illustrates an X-ray intensity distribution in which the size of the transparent area is 220 nm. However, when this is compared with an X-ray distribution (FIG. 5) in which the size of the transparent area is 90 nm, it is seen that the peak intensity is 1.5 times higher in FIG. 6. Since the peak intensity increases more than the ratio of the sizes of transparent areas, the width of the peak decreases rather than increases regardless of the fact that size of the transparent area increases.

If the X-ray dose for which the diffraction peak intensity has risen can be converted by some method to a direction that enlarges the width of the diffraction peak, i.e., if the X-ray intensity distribution can be defocused by a suitable amount, then it should be possible to enlarge the width of the resist pattern along with the size of the mast pattern.

As a means for achieving this, it is considered to change the shape of the mask absorbing area or the X-ray spectrum to thereby change the X-ray intensity distribution on the surface of the wafer. However, such a method is undesirable in that it not only complicates the apparatus but also may make it impossible to obtain the desired pattern.

Another method is to utilize some type of defocusing. Utilizing defocusing means performing a physical operation that corresponds to calculation for convoluting the X-ray intensity distribution on the wafer surface, and obtaining an exposure intensity distribution that differs from the X-ray intensity distribution on the wafer surface in a case where defocusing is not utilized.

In the case of a chemical amplification resist, acid produced by exposure diffuses into the resist to thereby raise sensitivity. Defocusing, therefore, is inherent. It is possible to control this defocusing by changing the conditions of PEB. If the PEB conditions are changed, however, the sensitivity of the resist also changes at the same time and it becomes necessary to determine the proper conditions. Changing the PEB conditions, therefore, is undesirable. Further, in an X-ray exposure apparatus, X-rays that impinge upon the resist produce secondary electrons. Since the secondary electrons diffuse, defocusing is inherent. Since defocusing produced by secondary electrons is decided by the spectrum of the X-rays that impinge upon the resist, it is necessary to change the spectrum for purposes of control. This is difficult.

SUMMARY OF THE INVENTION

Accordingly, an object of the present invention is to make it easy to control the defocusing of X-rays on a resist, which is an important factor in the manufacturing process, so as to make it possible to form a more appropriate resist pattern.

Another object of the present invention is to provide an X-ray exposure apparatus that improves process tolerance in terms of exposing finer patterns.

According to the present invention, the foregoing objects are attained by providing an X-ray exposure apparatus comprising: a plasma X-ray source for generating X-rays; a collimator for reducing a global divergence angle of X-rays that diverge from the X-ray source, and irradiating a reticle with the X-rays; and a moving mechanism for moving the collimator.

Preferably, in order to attain the foregoing objects, the local divergence angle of X-rays that impinge upon each point of a mask is changed in order to perform control for optimizing defocusing. Changing the local divergence angle of X-rays that impinge upon each point of a mask is achieved by providing an X-ray exposure apparatus having a plasma X-ray source for generating X-rays by plasma generation, and a collimator for converging X-rays that diverge from the X-ray source and reducing a global divergence angle to irradiate a reticle with the X-rays, wherein a pattern on the reticle is transferred to a substrate that has been coated with a photosensitive agent, the apparatus including a mechanism for changing the position of the collimator.

Further, the foregoing objects are attained by providing an X-ray exposure apparatus having a mechanism for changing the position of a collimator along the axial direction of the collimator or in a direction at right angles thereto.

Further, the foregoing objects are attained by providing an X-ray exposure apparatus having a mechanism for changing the position of a collimator in a direction at right angles to the axis of the collimator during exposure.

Further, the foregoing objects are attained by providing an X-ray exposure apparatus having two or more collimators and a function for exchanging these two or more collimators.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 13A and 13B are diagrams showing that the local divergence angle of X-rays, which impinge upon one point on a mask, is changed by changing the position of a collimator in an X-ray exposure apparatus according to a third embodiment;

FIG. 16 shows a specific example of a user interface;

FIG. 17 is a diagram useful in describing the flow of a device manufacturing process.

DESCRIPTION OF THE PREFERRED EMBODIMENTS

Preferred embodiments of the present invention will now be described in detail in accordance with the accompanying drawings.

(First Embodiment)

Figure 1:
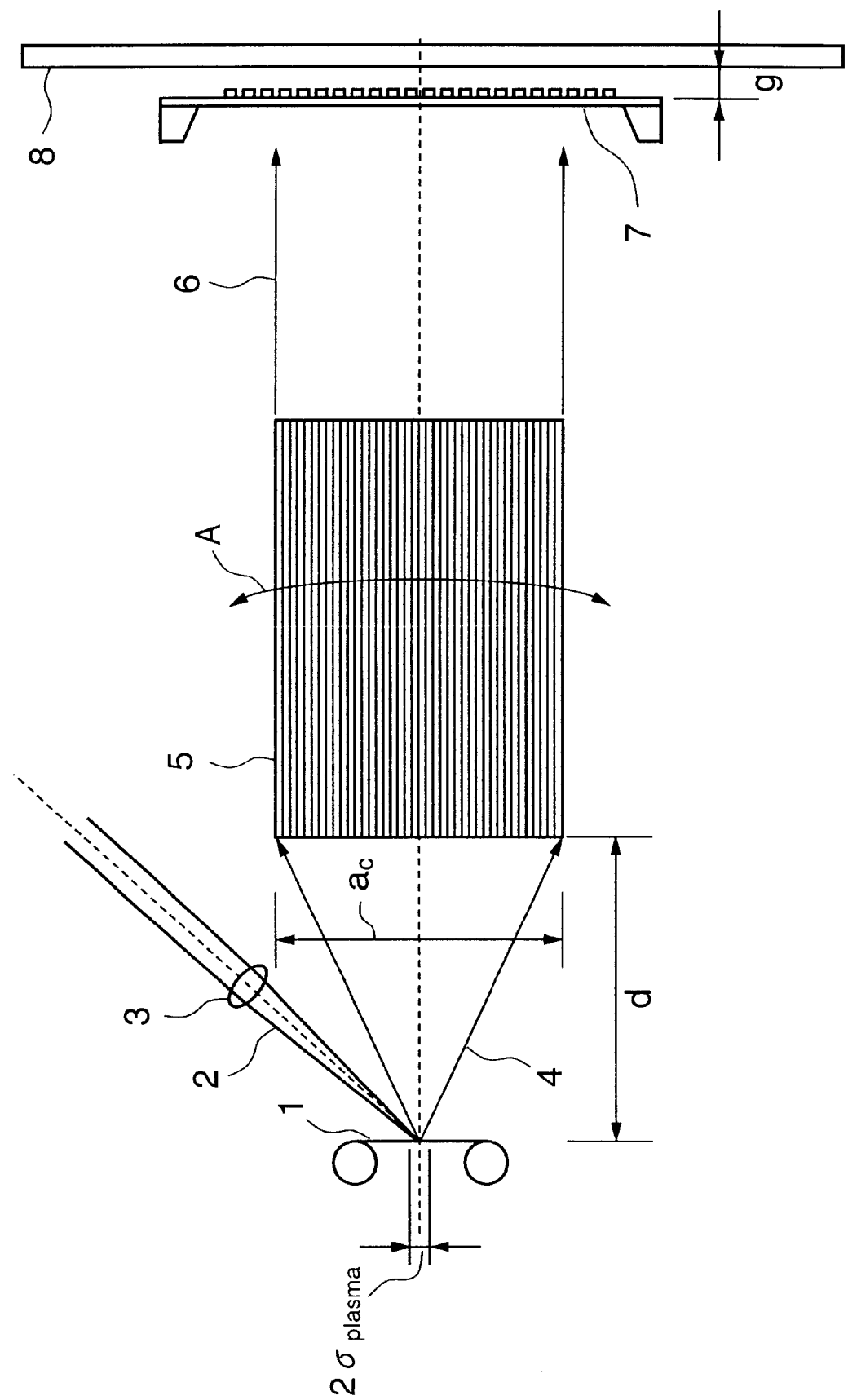
FIG. 1 is a structural view showing the principal components of an X-ray exposure apparatus according to a first embodiment of the present invention.

FIG. 1 is a structural view showing the principal components of an X-ray exposure apparatus according to a first embodiment of the present invention.

As shown in FIG. 1, the X-ray exposure apparatus includes a target 1, an optical system 3 for converging laser light 2, and a collimator 5 for reducing the divergence angle of X-rays 4 that diverge from a plasma produced on the target 1. The X-ray exposure apparatus irradiates a mask 7, which serves as a reticle, with the diverging X-rays 6 through the collimator 5, whereby a pattern on the mask 7 is transferred to a wafer 8 serving as a substrate.

In this proximity X-ray exposure apparatus in which the pattern on the mask 7 is transferred to the resist-coated wafer 8 by bringing the mask 7 and wafer 8 into opposition across a small gap g and irradiating the mask 7 with X-rays, the total amount of defocusing is given by $$\delta = \sqrt{(\delta x^2 + \delta e^2 + \delta r^2)}$$

where $\alpha$ represents the local divergence angle (described later) of the X-rays 6 that impinge upon one point on the wafer, $\delta x$ (=$g \times \alpha$) represents defocusing on the resist of the wafer 8 caused by the local divergence angle $\alpha$, $\delta e$ represents defocusing due to secondary electrons and $\delta r$ represents defocusing caused by diffusion of acid in the case of a chemical amplification resist. With a non-chemical amplification resist, $\delta r$ is zero. Since defocusing $\delta x$ caused by the local divergence angle, defocusing $\delta e$ due to secondary electrons and defocusing $\delta r$ caused by diffusion of acid in the case of a chemical amplification resist are all substantially in accordance with a normal distribution, overall defocusing also is substantially in accordance with a normal distribution.

With a plasma X-ray source that generates X-rays by producing a plasma, the distribution of the produced plasma is substantially a normal distribution. The angle $\delta_{c,x}$ of impinging X-rays from the X-ray entrance end of the collimator 5 has a spread given by $$\delta_{c,x} = [\sqrt{(a_c^2/3 + \sigma_{plasma}^2)}]/d$$

where $\sigma_{plasma}$ represents the standard deviation, $a_c$ the diameter of the aperture of collimator 5 and d the distance between the target 1 and the entrance end of the collimator 5. The reason for $a_c^2/3$ is that it is assumed that the transmission efficiency is a rectangular function in which transmission takes place entirely within the collimator 5 inside the aperture of the collimator 5 but is blocked 100% outside the aperture of the collimator 5. If this is calculated in terms of an equivalent normal distribution function, defocusing can be regarded as $\sqrt{(a_c^2/3)}$.

The X-rays 4 that impinge upon the entrance end of the collimator 5 with the above-mentioned spread are transmitted through the collimator 5 and emerge from the emission end of the collimator 5. If the X-rays 4 that impinge at the entrance end have an angular spread at this time, then the X-rays 6 that emerge from the emission end also are emitted with an angular spread. Since the X-rays are transmitted through the collimator 5 while being totally reflected, the X-rays are reflected within the collimator 5 at an angle that brings the X-rays close to the inner wall of the collimator 5. If reflection occurs one time, reflectivity will be small in the case of an incidence angle, the inclination of which is greater than 15 mrad. The intensity of the X-rays, therefore, undergoes a great deal of attenuation. If reflection occurs a plurality of times at the inner wall of the collimator, the intensity of the X-rays sustains a great deal of attenuation even in the case of an incidence angle whose inclination is greater than several mrad (3~5 mrad) at most. The end result is that only the X-rays 6 having a spread of several mrad at most emerge from the emission end of the collimator 5.

As a result of enlarging the opening of the collimator 5 at the entrance end of the collimator 5 to make the angular spread of the X-rays 4 that enter the opening of the collimator 5 greater than several mrad, those X-rays among the entrant X-rays 4 that impinge at an angle greater than several mrad are absorbed within the collimator 5 and do not emerge. This causes a decline in efficiency. This means that, at the same time, efficiency will decline also when the size of the light source (the size of the plasma) is too large.

The X-ray exposure apparatus according to this embodiment produces a plasma by irradiating the target 1 with laser light 2, as shown in FIG. 1. A metal tape or a solidified rare gas, etc., is used as the target 1. In order to increase the power of the laser per unit area, the target 1 is irradiated while the laser light 2 is converged by the optical system 3. X-rays 4 that diverge globally are produced from the plasma generated on the target 1. The X-rays 4 impinge upon the collimator 5, propagate through the interior of the collimator 5 and emerge as X-rays 6 the global divergence angle of which has been reduced. The mask 7 on which the pattern has been formed is irradiated with the X-rays 6. The pattern on the mask 7 is transferred to the wafer 8 coated with the photosensitive agent and placed in close proximity to the mask 7 across the gap g.

Figure 2:
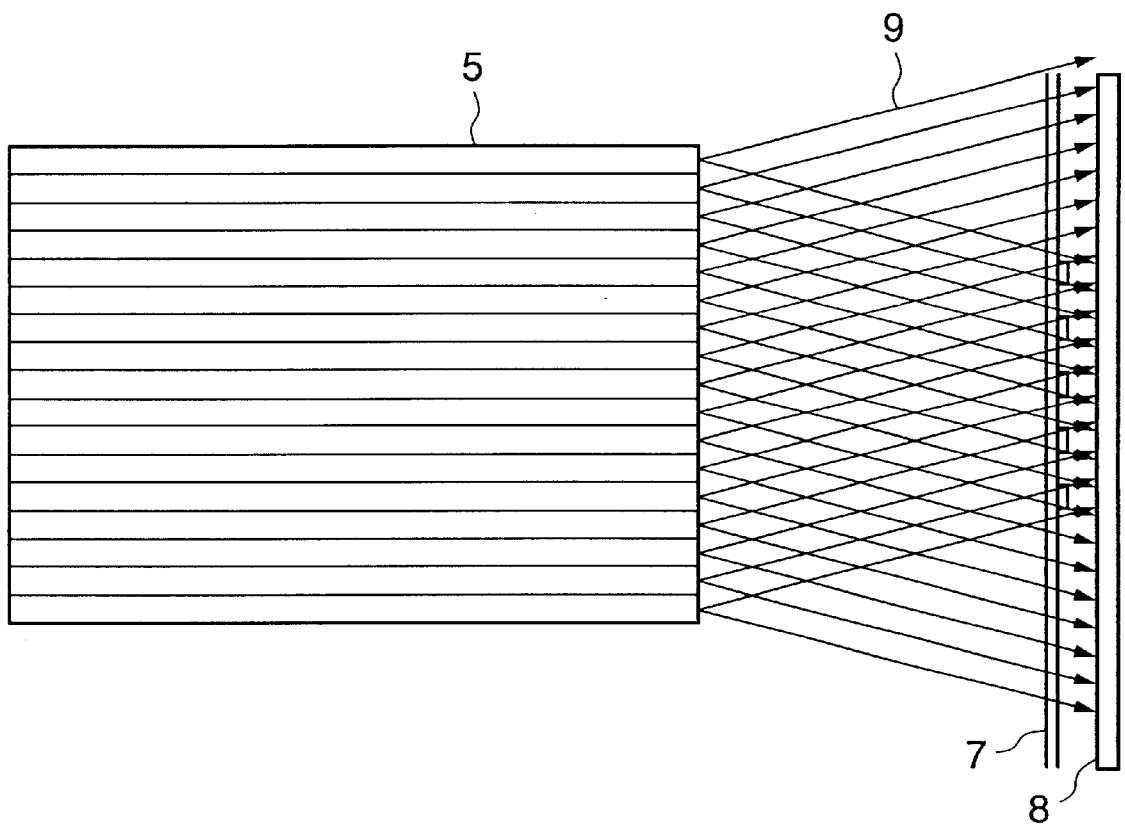
FIG. 2 is a diagram useful in describing X-rays emitted from the emission end of a collimator at a divergence angle.

In order to clarify the description, the global divergence angle of the X-rays that emerge from the collimator 5 is taken as zero in FIG. 1. In other words, the X-rays 6 that irradiate the entire surface of the mask 7 are parallel and therefore are not at an angle with respect to one another. The X-rays that emerge from each point at the emission end of the collimator 5 are emitted upon diverging, as shown in FIG. 2. The center lines of diverging X-rays 9 are parallel at each point on the emission end of the collimator 5. This is expressed by stating that the global divergence angle is zero. That is, the X-rays 6 that are emitted in parallel in FIG. 1 are the result of parallel emission of X-rays at the center of the X-rays that are emitted from each point upon diverging. This is expressed by stating that although the global divergence angle is zero at the emission end of the collimator 5, the local divergence angle is finite.

Though the global divergence angle here is made zero, it is possible to make it a finite value. When the size of the overall collimator 5 is small in comparison with the size of the mask 7 to be irradiated, it is useful to make the global divergence angle finite. In any case, the global divergence angle of the X-rays is different at both ends of the collimator 5. Making the global divergence angle small in back of the collimator 5 is useful in enlarging the power of the X-rays 6 that irradiate the mask 7.

Figure 3:
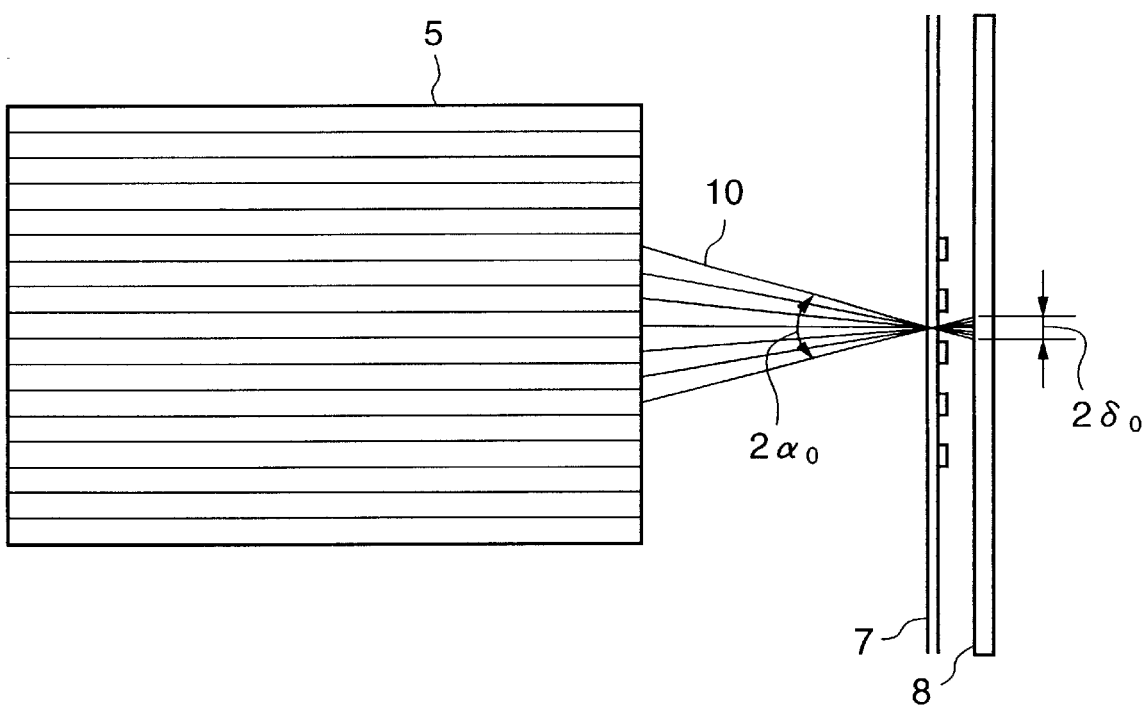
FIG. 3 is a diagram illustrating X-rays that impinge upon one point of a mask at a local divergence angle as well as defocusing on a resist (wafer)

In a case where X-rays having an angular spread that have been emitted from the emission end of the collimator 5 are seen from a point above the mask 7, as shown in FIG. 3, X-rays 10 that have emerged from different points on the collimator 5 impinge on the mask 7, and the X-rays that impinge upon each point on the mask 7 also come to have an angular spread. If the angular spread of the X-rays that have been emitted from the collimator 5 is several mrad at most, the angular spread of the X-rays that impinge upon each point of the mask 7 also becomes several mrad at most when the overall size of the collimator 5 is sufficiently large. This becomes the local divergence angle $\alpha$ of the X-rays 10 that impinge upon one point on mask 7. The local divergence angle $\alpha$ is uniquely decided when the collimator 5 is fixed at a certain position (a position at the distance d from the light source). Let this divergence angle be $\alpha_0$.

Figure 4A:
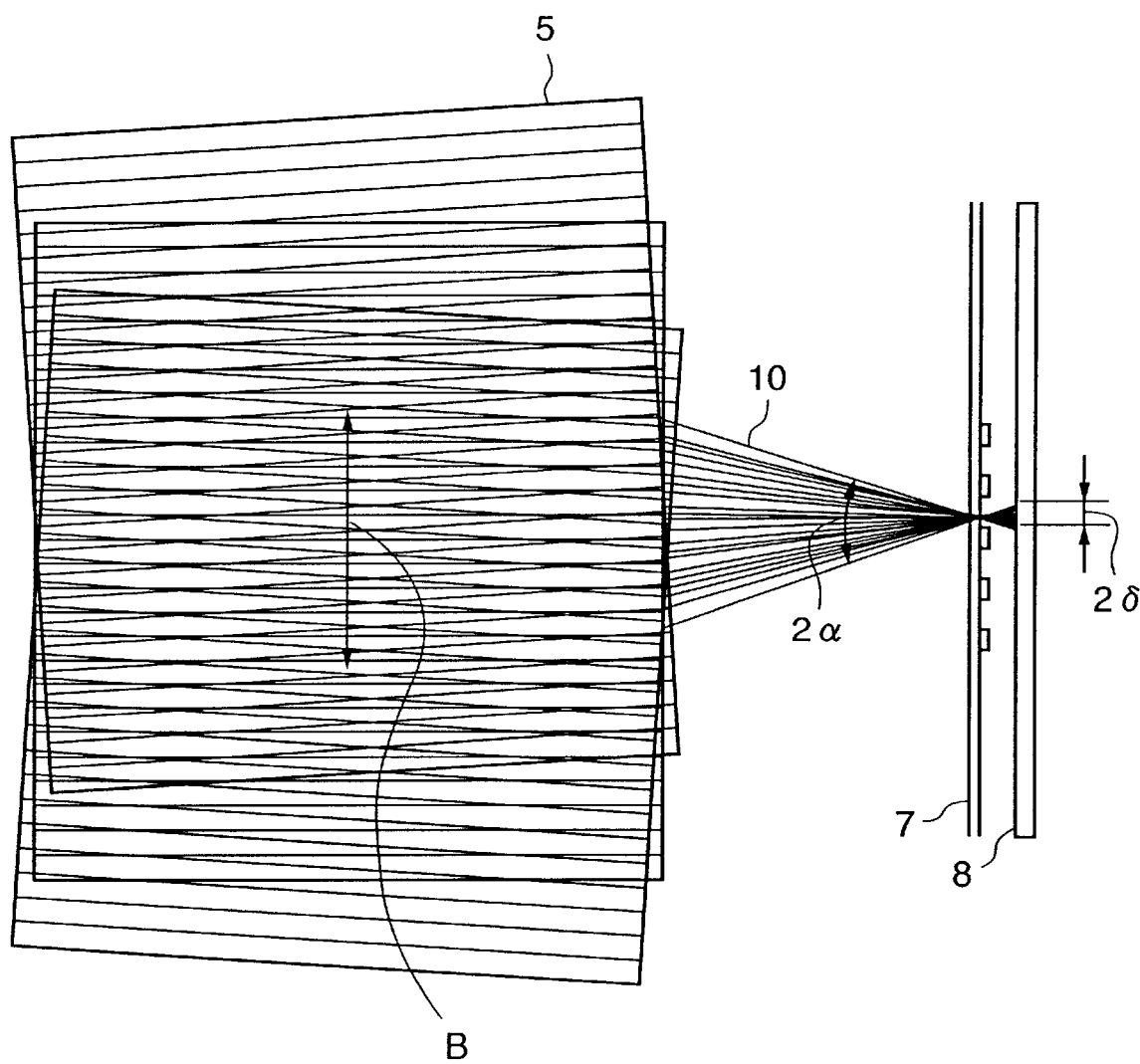
FIG. 4A is a diagram showing that the local divergence angle of X-rays, which impinge upon one point on a mask, is changed by changing the position and angle of a collimator.
Figure 4B:
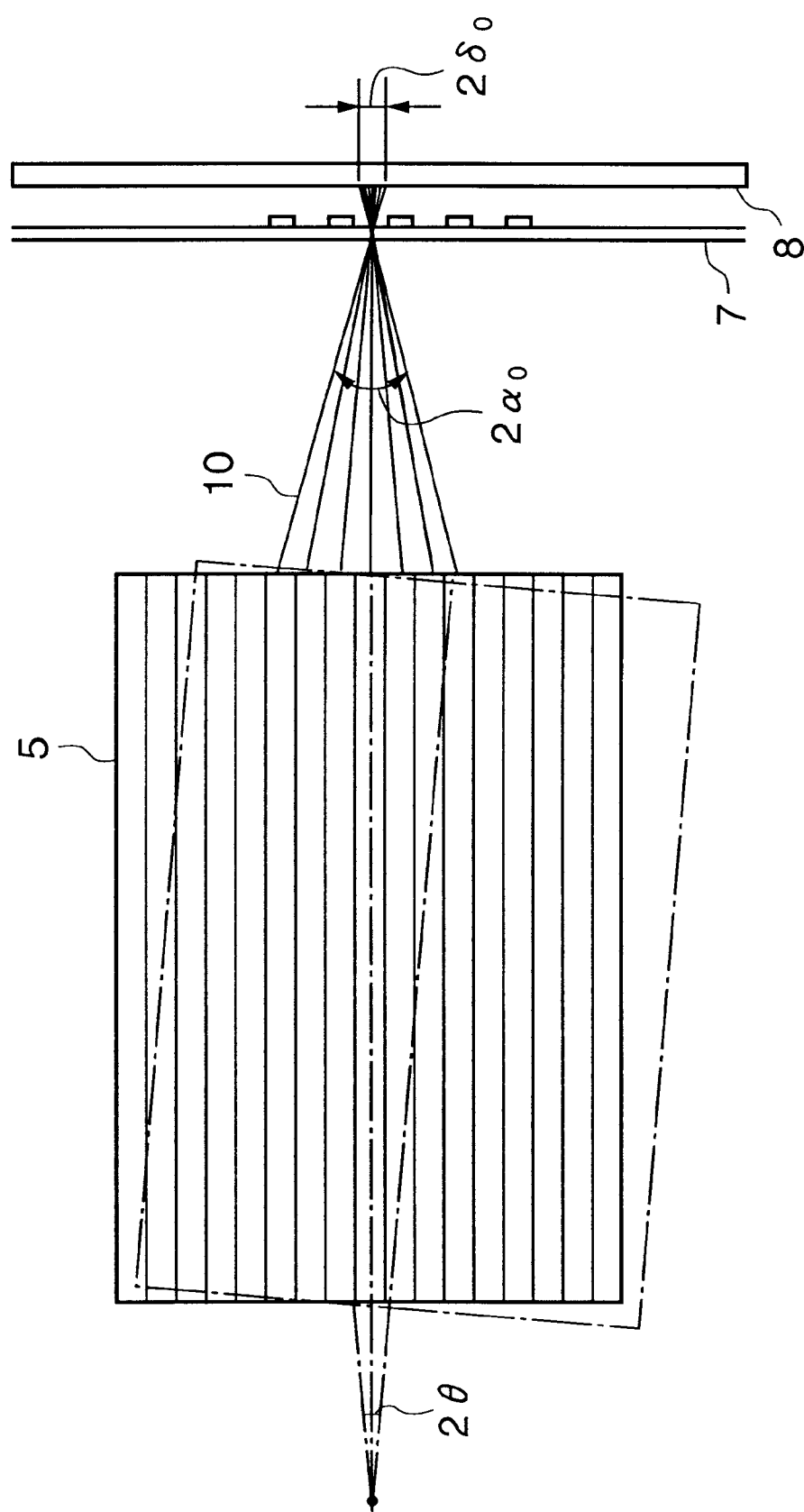
FIG. 4B is a diagram useful in describing the manner in which a collimator is swung through an angle of 2θ about an X-ray source.

If the collimator 5 has been moved as indicated by arrow A in FIG. 1, i.e., as indicated by arrow B in FIG. 4A, the angular spread (local divergence angle) of the X-rays 4 that impinge upon one point on the mask 7 widens further. If the collimator 5 is swung through an angle of 2θ about the X-ray source, as shown in FIG. 4B, the local divergence angle $\alpha$ becomes as follows:

$$\alpha = [\sqrt{(\theta^2/3 + \sigma_0^2)}]/d$$

The reason for $\theta^2/3$ here is that a case in which the collimator is swung uniformly over the range of 2θ is assumed. In cases other than one in which the collimator is swung uniformly over the range of 2θ, the above-mentioned equation differs and the local divergence angle $\alpha$ increases from $\alpha_0$.

Figure 5:
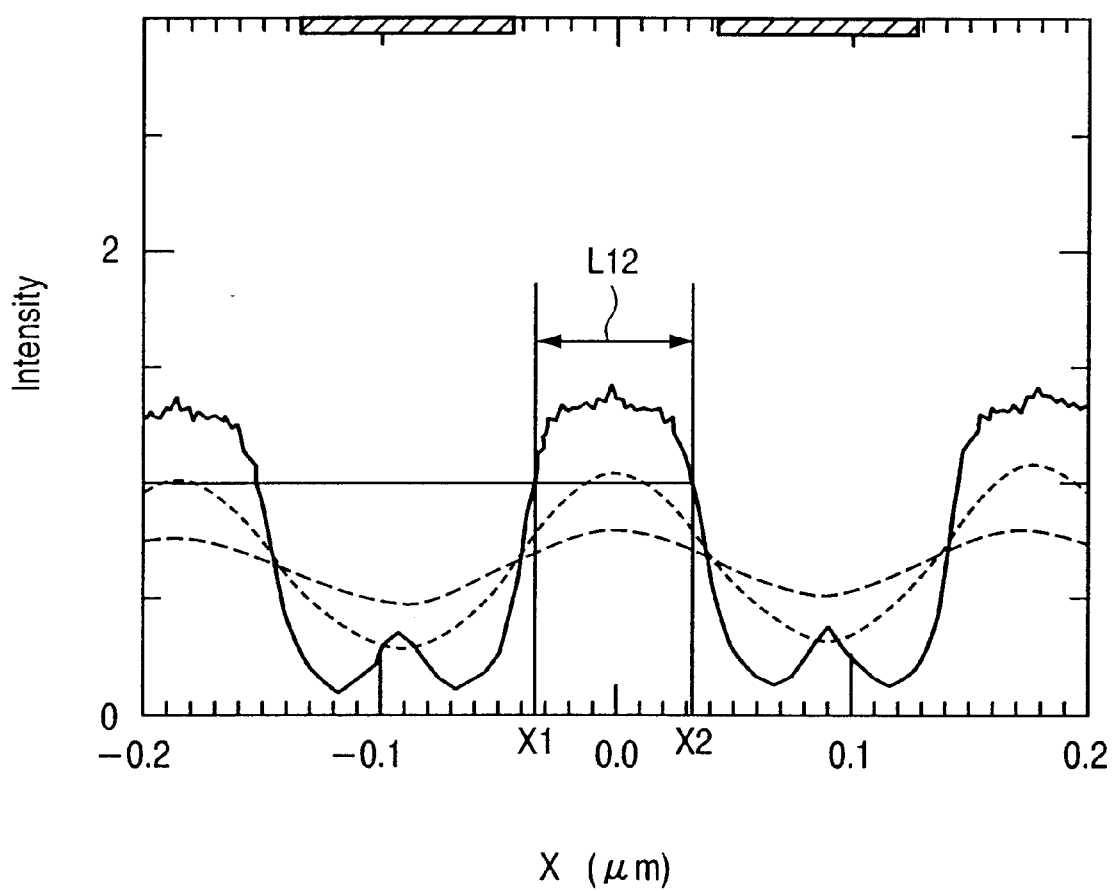
FIG. 5 is a diagram illustrating an example of an X-ray intensity distribution on a wafer surface, in which the distribution is produced by a mask pattern.
Figure 6:
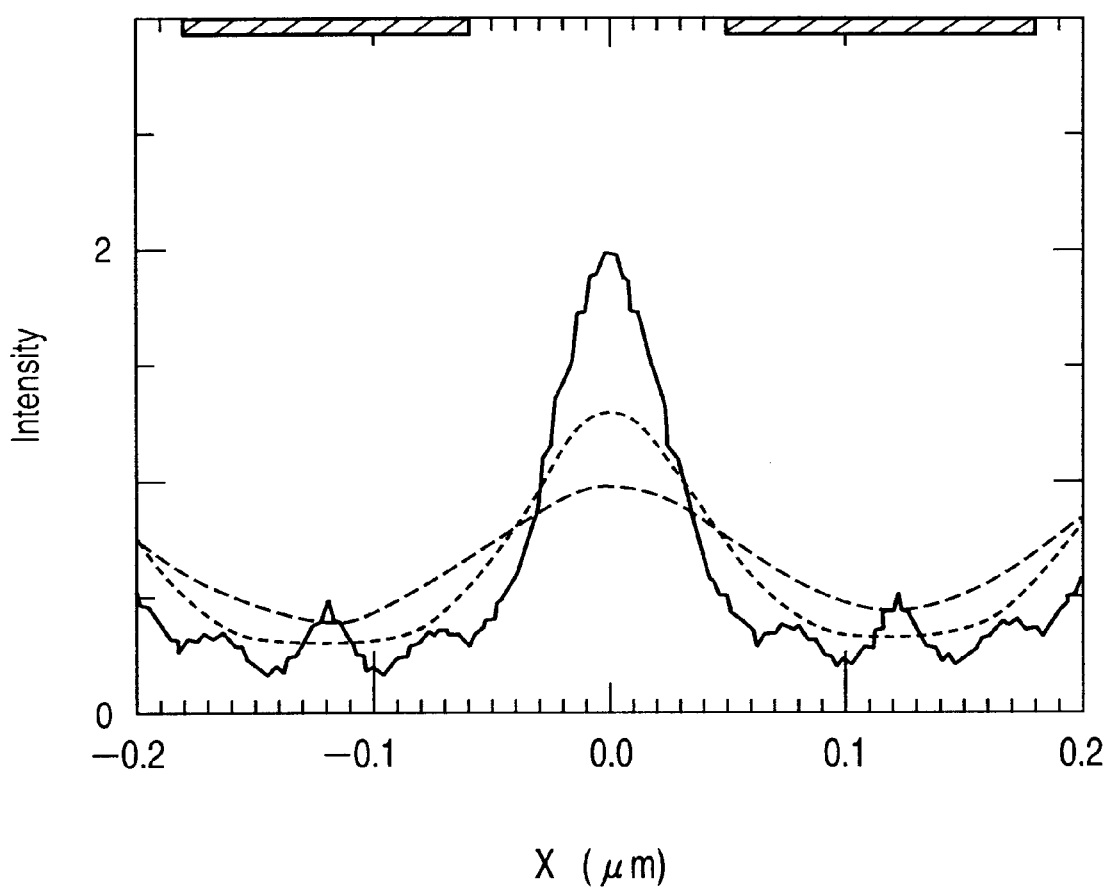
FIG. 6 is a diagram illustrating an example of an X-ray intensity distribution on a wafer surface, in which the distribution is produced by a mask pattern.

A calculation to determine how much defocusing should be utilized will now be illustrated. A graph in which the X-ray intensity distribution of FIG. 5 has been convoluted with a normal distribution function is indicated by the dotted and dashed lines. The dotted and dashed lines have been convoluted with normal distribution functions of σ=30 nm and 50 nm, respectively, assuming that the total amount δ of defocusing is represented by the standard deviation (σ).

Figure 7:
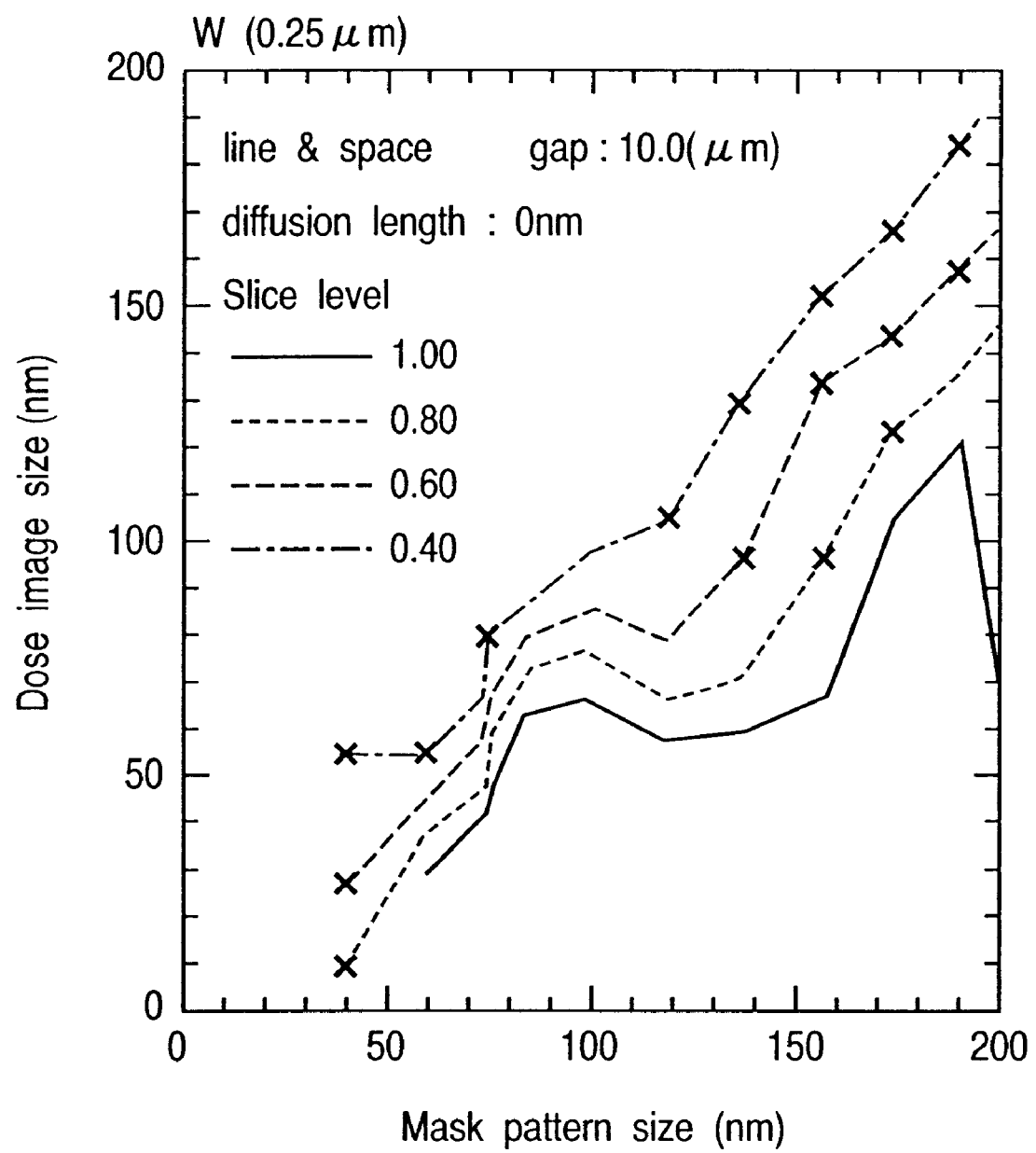
FIG. 7 is a diagram illustrating the relationship between the line width of a mask pattern and the line width of a resist pattern in an X-ray exposure apparatus according to the prior art.
Figure 8:
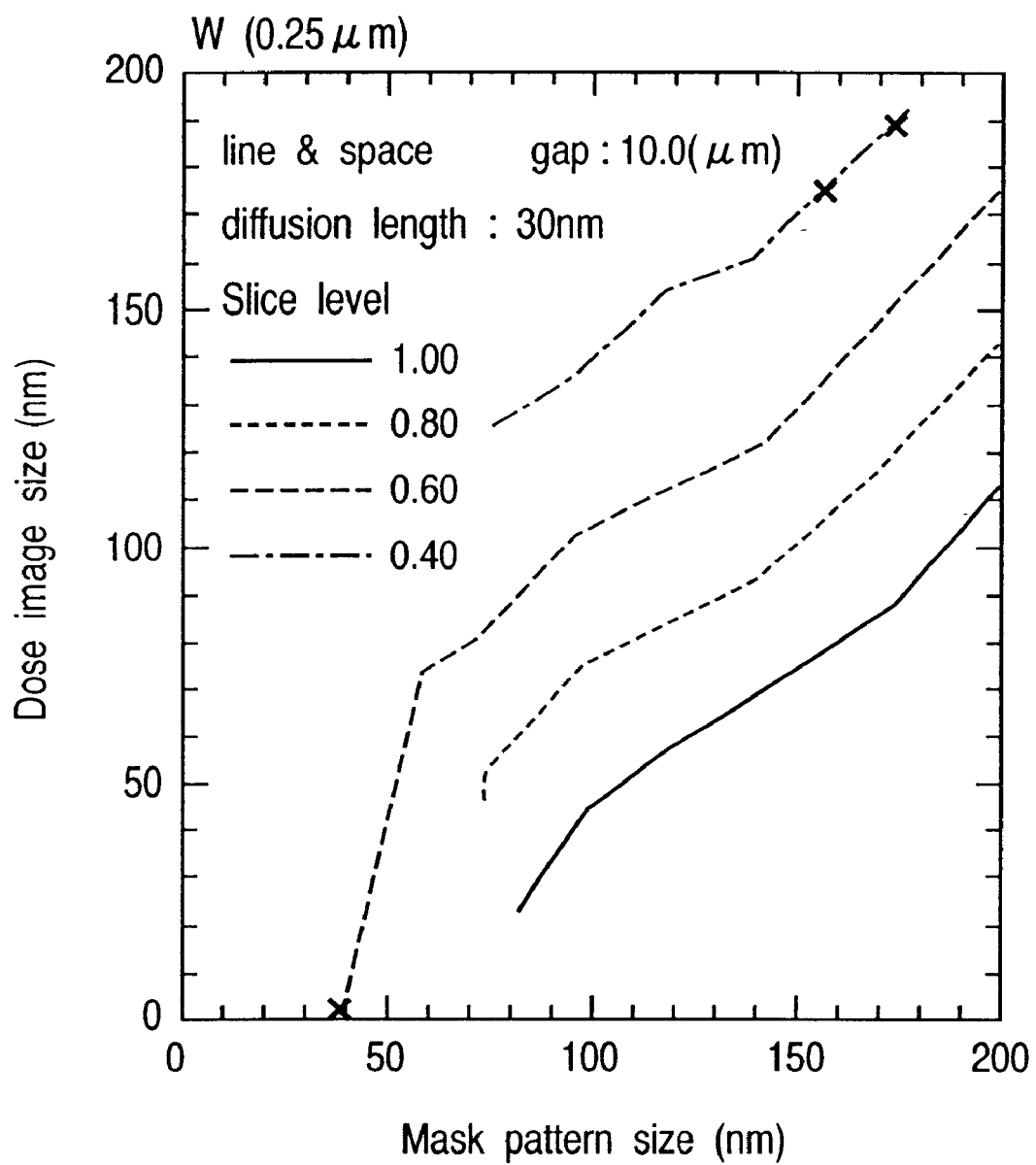
FIG. 8 is a diagram illustrating an example of the relationship between the line width of a mask pattern and the line width of a resist pattern based upon exposure using an X-ray exposure apparatus according to an embodiment of the present invention.

In a manner similar to FIG. 7, the X-ray intensity distribution at the transparent area of each size is convoluted at σ=30 nm, the slice levels are taken as 1.0, 0.8, 0.6 and 0.4, and the line width of the resist is found at each slice level. This is shown in FIG. 8. As will be understood from FIG. 8, even if the size of the mask pattern is increased, a region in which the resist pattern does not increase in size does not exist. This indicates that the amount of change in the mask pattern and the amount of change in the resist pattern are fairly close, i.e., that a linear relationship exists between the amounts of change in the mask pattern and resist pattern. This means the resist pattern can be transferred to the mask pattern faithfully.

Figure 9:
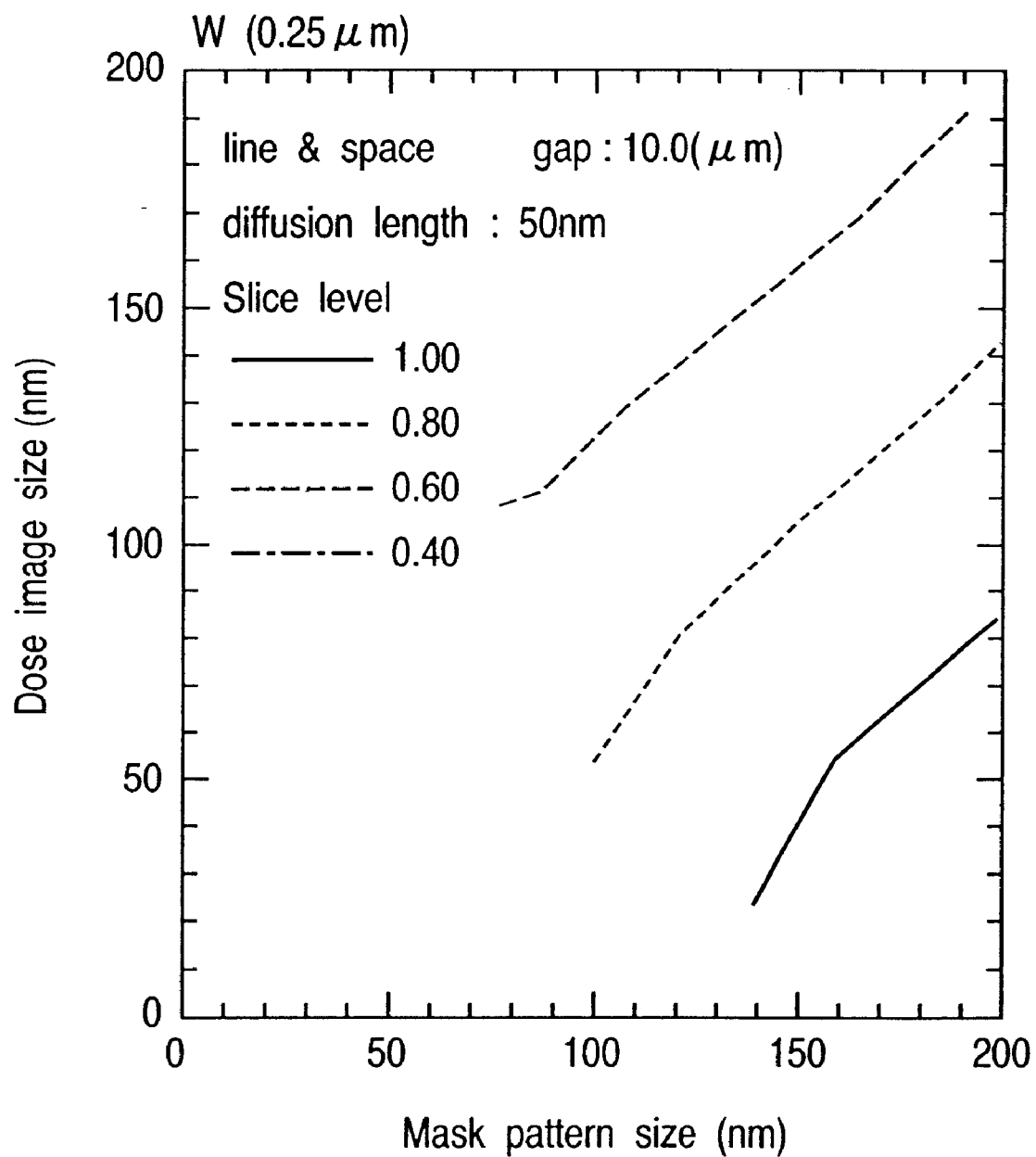
FIG. 9 is a diagram illustrating another example of the relationship between the line width of a mask pattern and the line width of a resist pattern based upon exposure using an X-ray exposure apparatus according to an embodiment of the present invention.

Further, FIG. 9 illustrates the relationship between the mask pattern and resist pattern in a case where the standard deviation a is made 50 μm. The slice levels and gap are the same as those in FIG. 8. It will be appreciated that in comparison with FIG. 8 (σ=30 nm), better linearity is achieved in FIG. 9 (σ=50 nm). In other words, this means that the faithfulness of the resist pattern to the mask pattern is increased. However, there is an increase in the minimum dimensions that can be resolved. For example, when the slice level is made 0.6, the limit on resolution is 50 nm (mask dimensions) at a standard deviation σ=30 nm and 70 nm at a standard deviation θ=50 nm. Whether the standard deviation σ should be made 30 nm or 50 nm is decided on a per-process basis or by the fabricated device depending upon whether the linearity between the mask pattern and resist pattern is important or the critical resolution.

Figure 4C:
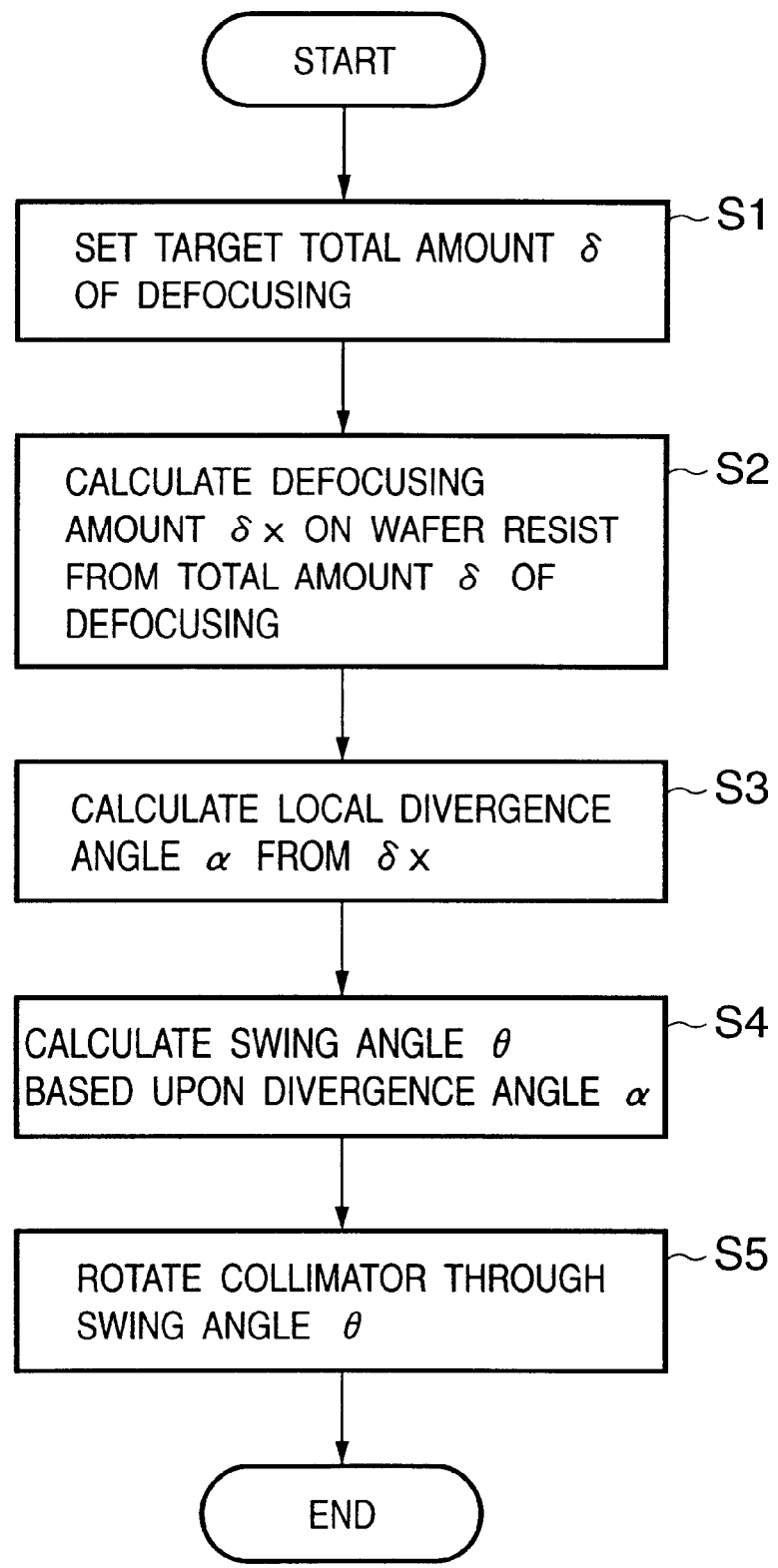
FIG. 4C is a flowchart useful in describing a procedure for controlling the rotating operation of a collimator.

A procedure for controlling movement of the collimator in the X-ray exposure apparatus of the above-described embodiment will now be described with reference to the flowchart of FIG. 4C. The control indicated by this flowchart is implemented by executing a prescribed control program by a CPU (not shown) incorporated in the X-ray exposure apparatus.

First, at step S1, the CPU sets a target total amount δ of defocusing. This setting can be performed at a console provided on the X-ray exposure apparatus. In this embodiment, the standard deviation σ is applied as the total amount δ of defocusing, as mentioned above. Next, at step S2, defocusing δx on the wafer is calculated from the total amount δ of defocusing. As mentioned earlier, the total amount δ of defocusing is represented by $\delta = \sqrt{(\delta x^2 + \delta e^2 + \delta r^2)}$. Since defocusing δe due to the secondary electrons is decided by the spectrum of the X-rays and defocusing δr caused by the diffusion of acid is decided by the wafer material, δx can be found.

The defocusing δx on the wafer is a function ($\delta x = \alpha \times g$) of the local divergence angle $\alpha$. Accordingly, the divergence angle $\alpha$ is found from δx at step S3. Furthermore, the local divergence angle $\alpha$ can be controlled by the swing angle θ of the collimator 5 in accordance with $\alpha = [\sqrt{(\theta^2/3 + \sigma_0^2)}]/d$, as set forth earlier. Next, at step S4, the swing angle θ of the collimator 5 is obtained from the divergence angle $\alpha$ using this equation. This is followed by step S5, at which the collimator is rotated through θ to both sides (i.e., through a total angle of 2θ) about the optic axis passing through the X-ray source.

Figure 4D:
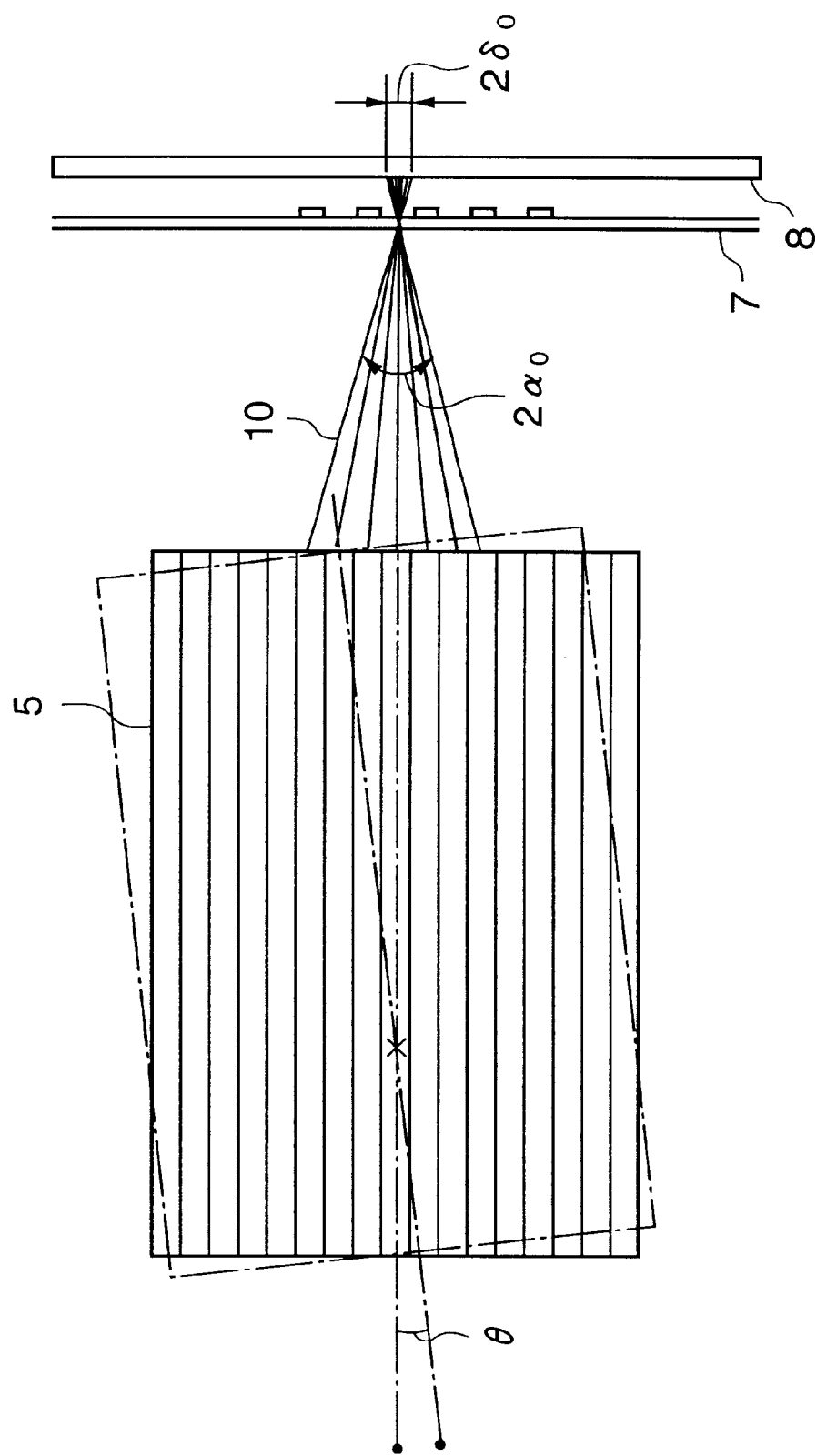
FIG. 4D is a diagram useful in describing the manner in which a collimator is swung over an angle of 2θ about one point on the central axis of the collimator.

Further, in this embodiment, the collimator 5 is swung about the light source. However, it goes without saying that the angular spread of the X-rays that impinge upon one point on the mask 7 can be changed regardless of where the center of movement of the collimator 5 is placed. For example, FIG. 4D shows the manner in which the collimator is swung through an angle θ to one side of a point (marked x) on the central axis of the collimator. In order that the efficiency of the X-rays that impinge upon the collimator 5 will not be reduced, it is more effective to move the light source (the X-ray source) at the same time, as illustrated in FIG. 4D.

In this embodiment, a case is described in which the laser plasma X-ray source is adopted as the light source. However, it is obvious that the light source may be a plasma X-ray source in which a pinch plasma is generated by an electrical discharge in a gas and X-rays are produced from this plasma.

(Second Embodiment)

Figures 10A, 10B:
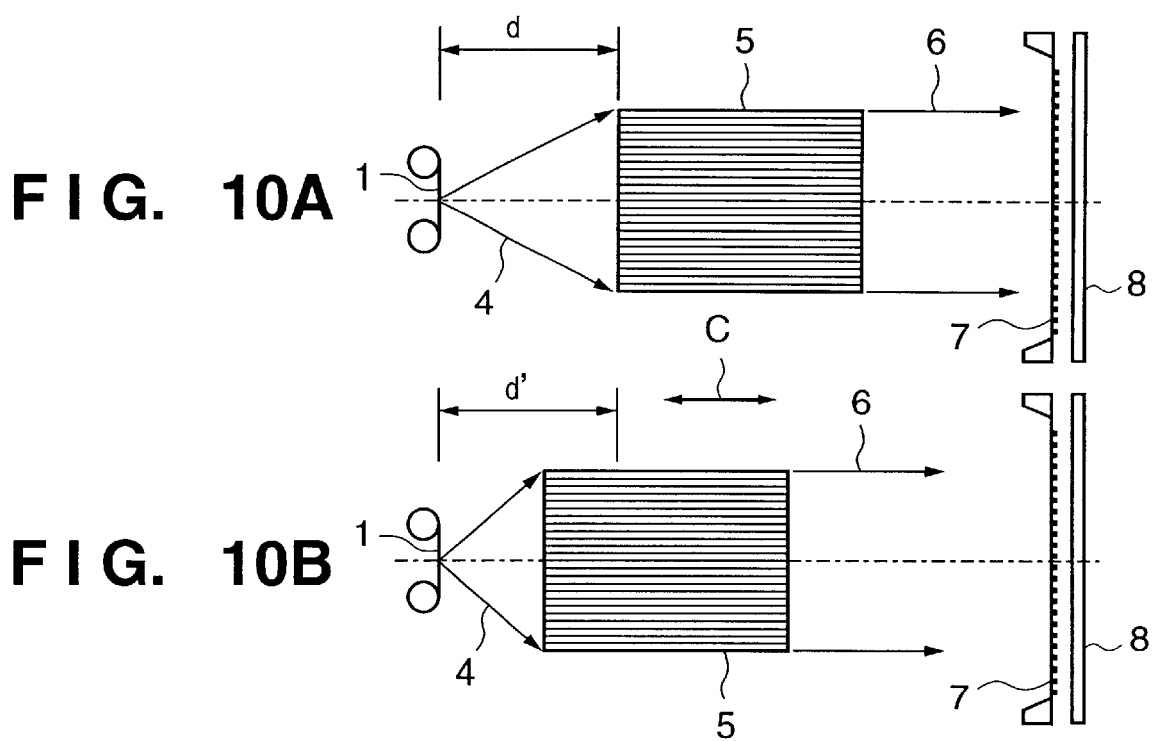
FIGS. 10A and 10B are structural views showing the principal components of an X-ray exposure apparatus according to a second embodiment of the present invention.
Figure 11A:
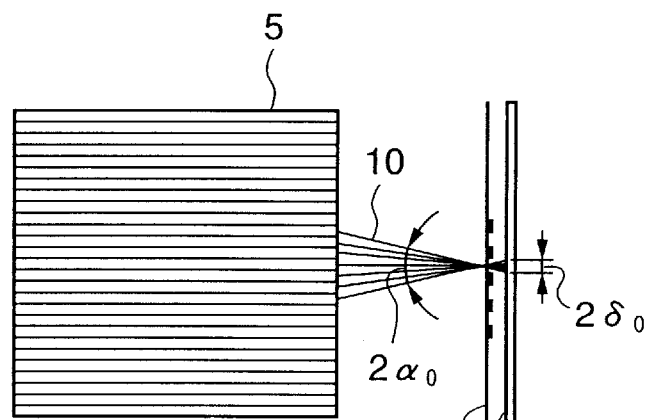
FIGS. 11A and 11B are diagrams showing that the local divergence angle of X-rays, which impinge upon one point on a mask, is changed by changing the position of a collimator in an X-ray exposure apparatus according to the second embodiment of the invention.
Figure 11B:
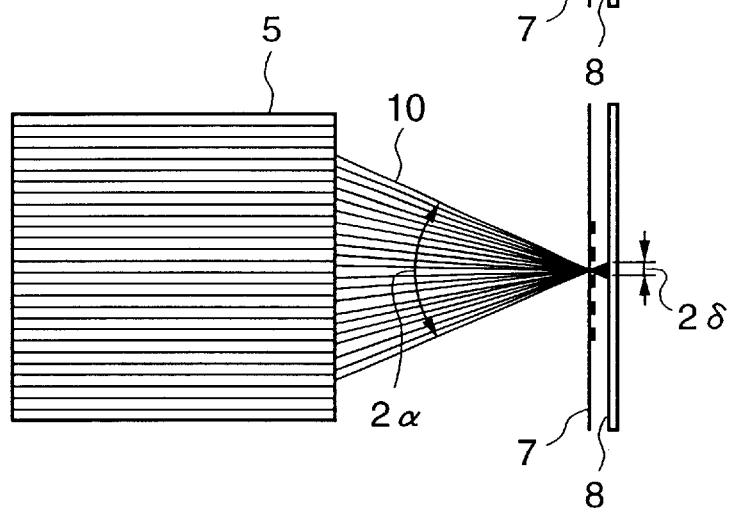

FIGS. 10A and 10B are structural views showing the principal components of an X-ray exposure apparatus according to a second embodiment of the present invention. In this embodiment, the collimator 5 can be moved along the optic axis in the direction of arrow C. If the collimator 5 is moved from the position shown in FIG. 10A to the position shown in FIG. 10B, the distance from the position of target 1 at which a plasma is generated to the entrance end of the collimator 5 changes from d to d'. As indicated by the equation for calculating $\delta_{c,x}$ in the first embodiment, the angular spread $\delta_{c,x}$ of the X-rays incident upon the collimator 5 is inversely proportional to the distance from the position of the target 1 at which the plasma is generated to the entrance end of the collimator 5. When the angular spread of the X-rays incident upon the collimator 5 is less than several mrad at most, therefore, the change in the angular spread of the incident X-rays becomes a change in the angular spread of the X-rays that emerge from the emission end of the collimator 5. As a result, as shown in FIGS. 11A, 11B, the angular spread of the X-rays 10 that impinge upon one point on the mask 7, namely the local divergence angle, changes from $\alpha_0$ shown in FIG. 11A to $\alpha$ shown in FIG. 11B.

By thus controlling the local divergence angle $\alpha$, the amount of defocusing can be controlled.

(Third Embodiment)

Figures 12A, 12B:
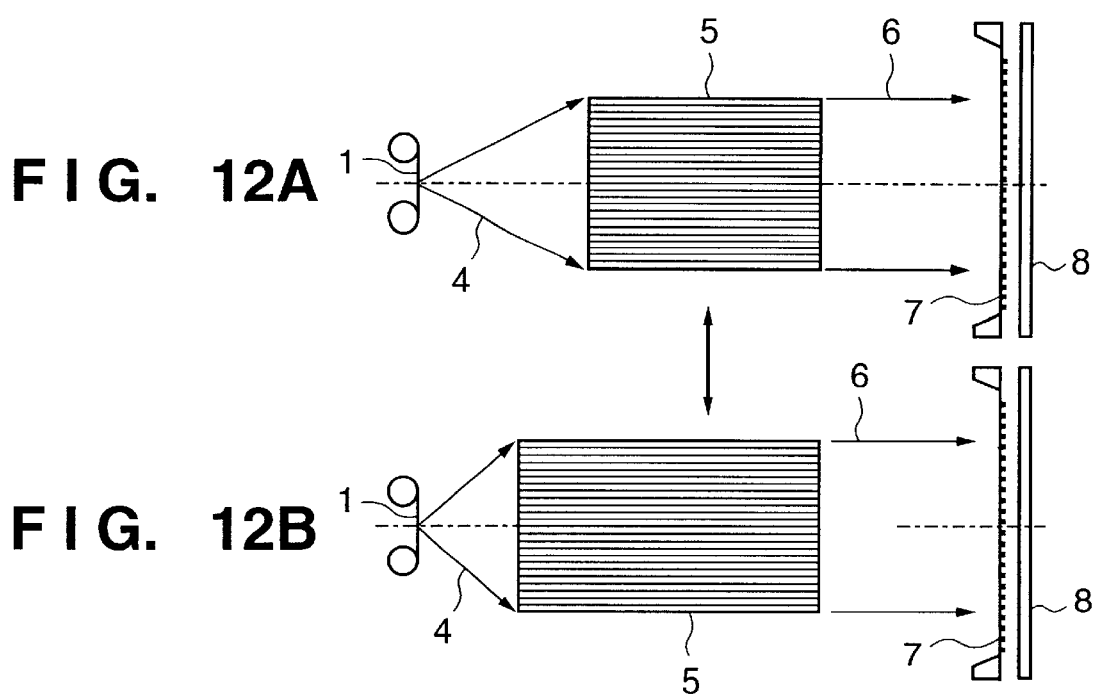
FIGS. 12A and 12B are structural views showing the principal components of an X-ray exposure apparatus according to a third embodiment of the present invention.

FIGS. 12A and 12B are structural views showing the principal components of an X-ray exposure apparatus according to a third embodiment of the present invention. In this embodiment, two collimators 5 are capable of being exchanged. Since the arrangement is such that the entrance end is made to approach the light source, as shown in FIGS. 12A, 12B, the angular spread of the X-rays that impinge upon one point on the mask 7 changes from $\alpha_0$ shown in FIG. 13A to $\alpha$ shown in FIG. 13B, in a manner equivalent to the second embodiment. In this case, it is possible to fix the distance from the emission end of the collimator 5 to the surface of the mask. As a result, an optimum distance corresponding to the local divergence angle can be set in the pattern region of the mask 7.

In other words, in the second embodiment, the same collimator 5 is moved back and forth. If the collimator 5 is made to approach the side of the light source, therefore, the angular spread of the X-rays emitted from the collimator 5 enlarges and, at the same time, the distance from the emission end of the collimator 5 to the mask surface lengthens. As a result, a so-called penumbra region, in which intensity gradually weakens near the periphery, widens. Consequently, the irradiated region of substantially uniform intensity decreases. In order to avoid this, it is necessary to perform an operation such as making the mask surface approach the collimator 5. This is a more complicated apparatus. With the third embodiment, on the other hand, the distance from the emission end of the collimator 5 to the mask surface is held fixed. As a result, the influence of the enlarged angular spread of the X-rays emitted from the collimator 5 is cancelled out and the increase in the penumbra region can be reduced or eliminated.

(Fourth Embodiment)

(Embodiment of Semiconductor Production System)

Described next will be an example of a system for producing semiconductor devices (semiconductor chips such as IC and LSI chips, liquid crystal panels, CCDs, thin-film magnetic heads and micromachines, etc.) using the X-ray exposure apparatus according to the present invention. This system utilizes a computer network outside the semiconductor manufacturing plant to provide troubleshooting and regular maintenance of manufacturing equipment installed at the manufacturing plant and to furnish maintenance service such as the provision of software.

Figure 14:
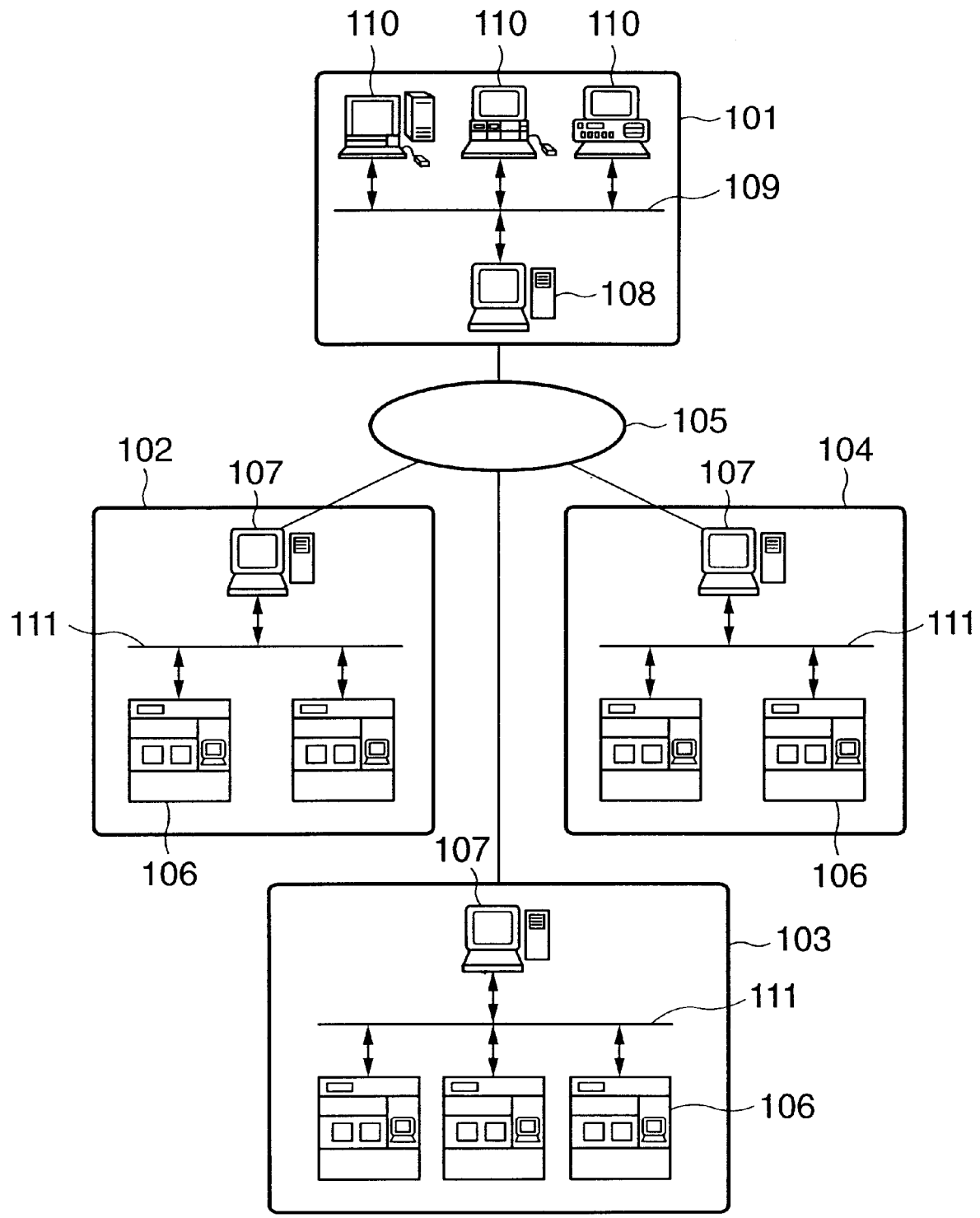
FIG. 14 is a conceptual view showing a semiconductor device production system that uses an X-ray exposure apparatus according to the present invention, wherein the system is as seen from a certain angle.

FIG. 14 illustrates the overall system as seen from a certain angle. The system includes the business office 101 of the vendor (equipment supplier) that provides the equipment for manufacturing semiconductor devices. Semiconductor manufacturing equipment for performing various processes used in a semiconductor manufacturing plant is assumed to be the manufacturing equipment. Examples of the equipment are pre-treatment equipment (lithographic equipment such as exposure equipment, resist treatment equipment and etching equipment, heat treatment equipment, thin-film equipment and smoothing equipment, etc.) and post-treatment equipment (assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111 which connects these pieces of equipment to construct an intranet, and a host management system 107 serving as a monitoring unit for monitoring the status of operation of each piece of manufacturing equipment 106.

The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited.

More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side.

A communication protocol (TCP/IP), which is used generally over the Internet, can be employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 15:
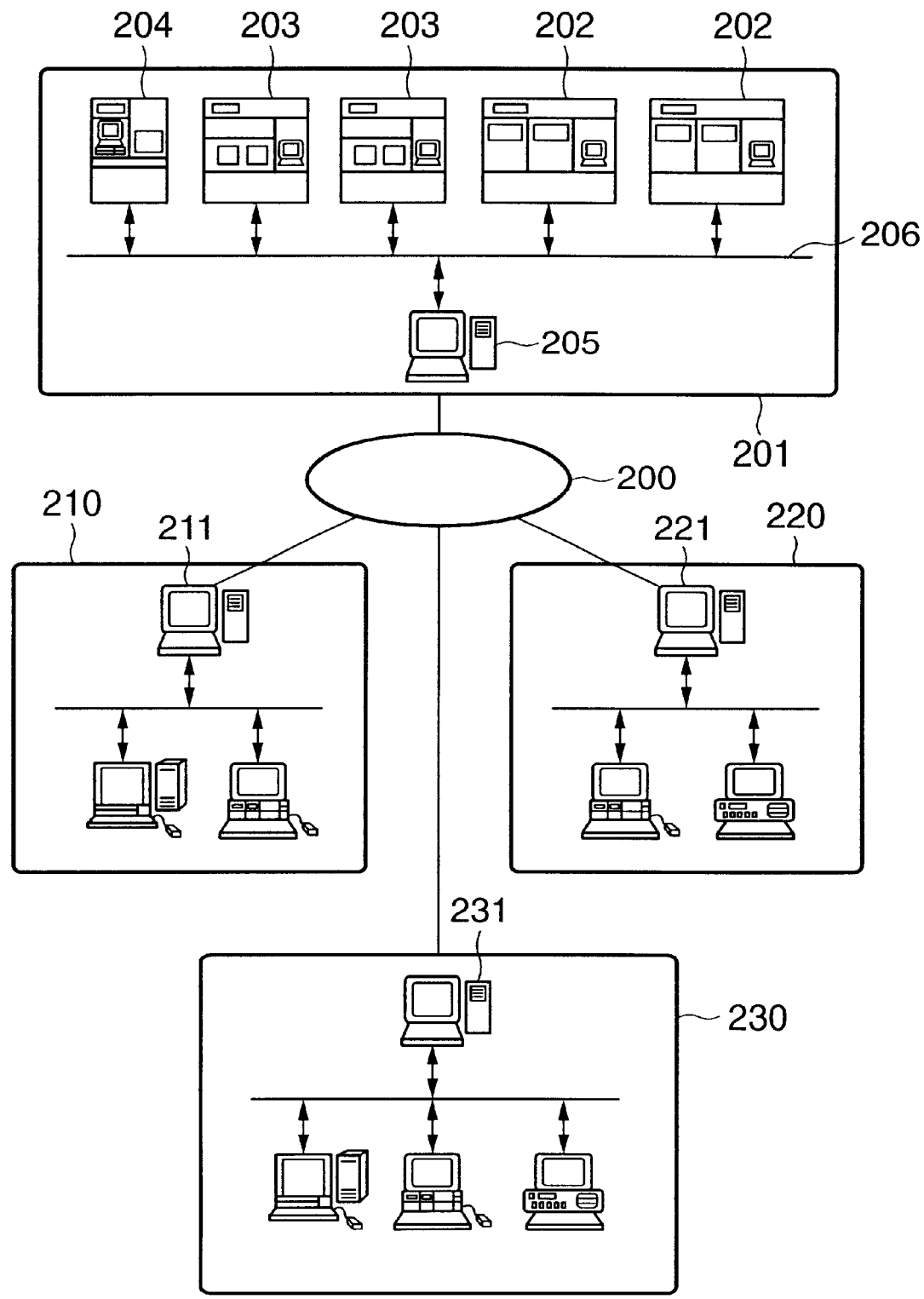
FIG. 15 is a conceptual view showing a semiconductor device production system that uses an X-ray exposure apparatus according to the present invention, wherein the system is as seen from another angle.

FIG. 15 is a conceptual view illustrating the overall system of this embodiment as seen from an angle different from that depicted in FIG. 14. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 15, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication.

This system includes a manufacturing plant 201 of the user of the manufacturing equipment (e.g., the maker of semiconductor devices). The manufacturing line of this plant includes manufacturing equipment for implementing a variety of processes. Examples of such equipment are exposure equipment 202, resist treatment equipment 203 and thin-film treatment equipment 204. Though only one manufacturing plant 201 is shown in FIG. 15, in actuality a plurality of these plants are networked in the same manner. The pieces of equipment in the plant are interconnected by a LAN 206 to construct an intranet and the operation of the manufacturing line is managed by a host management system 205.

The business offices of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier. The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 16, on the display. The operator managing the manufacturing equipment at each plant enters information at the input items on the screen while observing the screen. The information includes model 401 of the manufacturing equipment, its serial number 402, subject matter 403 of the problem, its date of occurrence 404, degree of urgency 405, the particular condition 406, countermeasure method 407 and progress report 408. The entered information is transmitted to the maintenance database via the Internet. The appropriate maintenance information is sent back from the maintenance database and is presented on the display screen.

The user interface provided by the Web browser implements hyperlink functions 410 to 412 as illustrated and enables the operator to access more detailed information for each item, to extract the latest version of software, which is used for the manufacturing equipment, from a software library provided by the vender, and to acquire an operating guide (help information) for reference by the plant operator. Here the maintenance information provided by the maintenance database also includes the above-described information relating to the present invention, and the software library also provides the latest software for implementing the present invention.

A process for manufacturing a semiconductor device utilizing the production system set forth above will now be described.

FIG. 17 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 18:
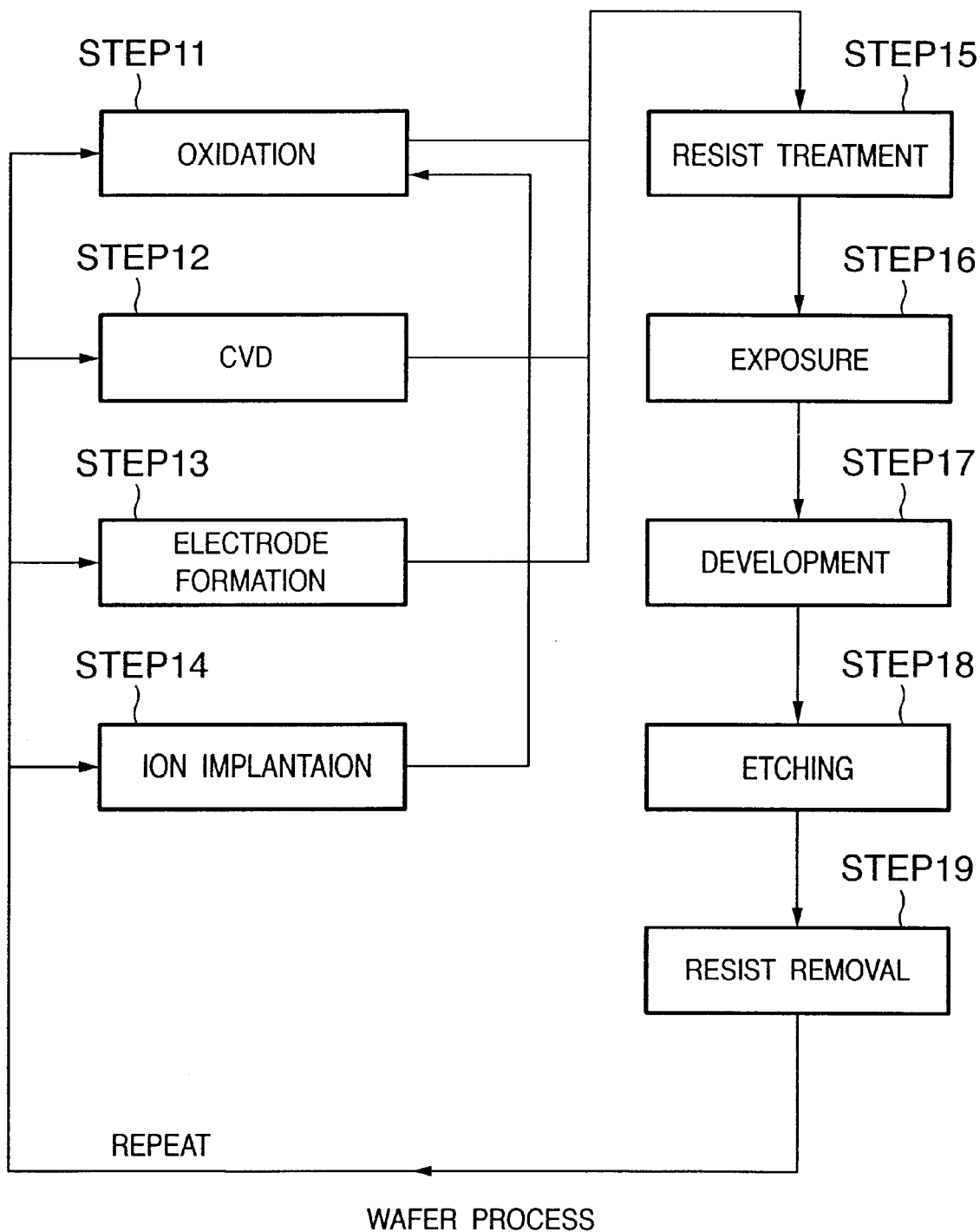
FIG. 18 is a diagram useful in describing a wafer process.

FIG. 18 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal).

Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, with the X-ray exposure apparatuses described above, defocusing on a resist, which is an important process factor, can be changed by changing the angular spread of X-rays that impinge upon each point on a reticle such as a mask. As a result, controllable parameters are increased, a more suitable resist pattern can be obtained and process tolerance in terms of exposing finer patterns is improved.

As many apparently widely different embodiments of the present invention can be made without departing from the spirit and scope thereof, it is to be understood that the invention is not limited to the specific embodiments thereof except as defined in the appended claims.

What is claimed is:

1. An X-ray exposure apparatus comprising:
   a plasma X-ray source for generating X-rays;
   a collimator for reducing a global divergence angle of X-rays that diverge from said X-ray source, and irradiating a reticle with the X-rays; and
   a moving mechanism for moving said collimator.

2. The apparatus according to claim 1, wherein said moving mechanism swings said collimator through a predetermined angle about an axis, which is adopted as a central axis, that is perpendicular to the optic axis of said collimator.

3. The apparatus according to claim 2, wherein the position of the central axis coincides with the position of said X-ray source.

4. The apparatus according to claim 2, wherein the position of the central axis is a point on the optic axis.

5. The apparatus according to claim 4, wherein said moving mechanism moves said X-ray source in accordance with swinging of said collimator so as to maintain a relative positional relationship between an entrance end of said collimator and said X-ray source.

6. The apparatus according to claim 4, wherein said moving mechanism changes the distance between an entrance end of said collimator and said X-ray source.

7. The apparatus according to claim 6, wherein said moving mechanism moves said collimator along the optic axis.

8. The apparatus according to claim 6, wherein there are provided a plurality of collimators having different lengths along their optic axes; and said moving mechanism changes over the collimator to be used among these plurality of collimators so as to maintain a predetermined distance between an emission end of the collimator and the reticle.

9. The apparatus according to claim 1, further comprising a display, a network interface and a computer for running network software, wherein maintenance information concerning said X-ray exposure apparatus is communicated via a computer network.

10. The apparatus according to claim 9, wherein the network software is connected to an external network of a plant at which said X-ray exposure apparatus has been installed;

said display is provided with a user interface for accessing a maintenance database provided by a vendor or user of said X-ray exposure apparatus; and information is obtained from said database via said external network.

11. The apparatus according to claim 1, wherein said moving mechanism moves said collimator in order to change a local divergence angle of X-rays that impinge upon one point of the reticle owing to said collimator.

12. A method of controlling an X-ray exposure apparatus having a plasma X-ray source for generating X-rays, and a collimator for reducing a global divergence angle of X-rays that diverge from said X-ray source, and irradiating a reticle with the X-rays, said method comprising:

a setting step of setting an amount of defocusing on a substrate to be exposed to X-rays that have passed through the reticle; and a moving step of moving said collimator based upon the amount of defocusing set at said setting step.

13. The method according to claim 12, further comprising a calculation step of calculating a local divergence angle of X-rays, which impinge upon one point of the reticle owing to said collimator, based upon the amount of defocusing set at said setting step, and wherein, in said moving step, said collimator is moved so as to obtain the divergence angle obtained at said calculation step.

14. The method according to claim 12, wherein said moving step includes swinging said collimator through a predetermined angle about an axis, which is adopted as a central axis, that is perpendicular to the optic axis of said collimator, said predetermined angle being decided based upon the divergence angle obtained at said calculation step.

15. The method according to claim 14, wherein the position of the central axis coincides with the position of said X-ray source.

16. The method according to claim 14, wherein the position of the central axis is a point on the optic axis.

17. The method according to claim 16, wherein said moving step includes moving said X-ray source in accordance with swinging of said collimator so as to maintain a relative positional relationship between an entrance end of said collimator and said X-ray source.

18. The method according to claim 12, wherein said moving step includes setting a predetermined distance between an entrance end of said collimator and said X-ray source, said predetermined distance being decided based upon the divergence angle obtained at said calculation step.

19. The method according to claim 18, wherein said moving step includes moving said collimator along the optic axis.

20. The method according to claim 18, wherein there are provided a plurality of collimators having different lengths along their optic axes; and said moving step includes changing over the collimator to be used among these plurality of collimators, based upon the predetermined distance that has been decided, so as to hold fixed the distance between an emission end of the collimator and the reticle.

21. A method of manufacturing devices, comprising steps of:

placing a plurality of items of semiconductor manufacturing equipment, inclusive of an X-ray exposure apparatus, in a plant; and manufacturing a semiconductor device using said plurality of items of semiconductor manufacturing equipment, said X-ray exposure apparatus having:

a plasma X-ray source for generating X-rays;

a collimator for reducing a global divergence angle of X-rays that diverge from said X-ray source, and irradiating a reticle with the X-rays; and a moving mechanism for moving said collimator.

22. The method according to claim 21, further comprising the steps of:

connecting said plurality of items of semiconductor manufacturing equipment by a local-area network;

connecting said local-area network and an external network outside the plant;

acquiring information concerning said X-ray exposure apparatus from a database on the external network utilizing said local-area network and said external network; and controlling said X-ray exposure apparatus based upon the information acquired.

23. The method according to claim 22, wherein maintenance information for said manufacturing equipment is obtained by accessing, by data communication via the external network, a database provided by a vendor of said manufacturing equipment or by a user, or production management is performed by data communication with a semiconductor manufacturing plant other than the first mentioned semiconductor manufacturing plant via the external network.

24. A semiconductor manufacturing plant, comprising:

a plurality of items of semiconductor manufacturing equipment inclusive of an X-ray exposure apparatus;

a local-area network for interconnecting said plurality of items of manufacturing equipment; and a gateway for connecting said local-area network and an external network outside said semiconductor manufacturing plant, wherein said X-ray exposure apparatus has:

a plasma X-ray source for generating X-rays;

a collimator for reducing a global divergence angle of X-rays that diverge from said X-ray source, and irradiating a reticle with the X-rays; and a moving mechanism for moving said collimator.

25. A method of maintaining an X-ray exposure apparatus, comprising the steps of:

preparing a database, which stores information relating to maintenance of said X-ray exposure apparatus, on an external network outside a plant at which said X-ray exposure apparatus has been installed;

connecting said X-ray exposure apparatus to a local-area network inside said plant; and maintaining said X-ray exposure apparatus, based upon information that has been stored in said database, utilizing said external network and said local-area network, wherein said X-ray exposure apparatus has:

a plasma X-ray source for generating X-rays;

a collimator for reducing a global divergence angle of X-rays that diverge from said X-ray source, and irradiating a reticle with the X-rays; and a moving mechanism for moving said collimator.

* * * * *